US008692817B2

(12) United States Patent
Hong

(10) Patent No.: US 8,692,817 B2
(45) Date of Patent: Apr. 8, 2014

(54) ORGANIC LIGHT-EMITTING DISPLAY DEVICE

(75) Inventor: Sang-Min Hong, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 300 days.

(21) Appl. No.: 13/067,086

(22) Filed: May 6, 2011

(65) Prior Publication Data

US 2012/0169683 A1    Jul. 5, 2012

(30) Foreign Application Priority Data

Jan. 4, 2011    (KR) .................. 10-2011-0000546

(51) Int. Cl.
*G09G 5/00*    (2006.01)

(52) U.S. Cl.
USPC ......................................................... 345/206

(58) Field of Classification Search
USPC ................................................. 345/206, 212
See application file for complete search history.

(56) References Cited

U.S. PATENT DOCUMENTS

| | | | |
|---|---|---|---|
| 2003/0155860 | A1 | 8/2003 | Choi et al. |
| 2006/0097631 | A1 | 5/2006 | Lee |
| 2007/0046185 | A1 | 3/2007 | Kim |
| 2009/0322215 | A1* | 12/2009 | Sung et al. ............... 313/504 |
| 2011/0114974 | A1* | 5/2011 | Song et al. ................ 257/89 |

FOREIGN PATENT DOCUMENTS

| | | |
|---|---|---|
| JP | 2010-3880 A | 1/2010 |
| KR | 2003-0069434 A | 8/2003 |
| KR | 10-2006-0042779 A | 5/2006 |
| KR | 10-2007-0024286 A | 3/2007 |
| KR | 10-2007-0034769 A | 3/2007 |
| KR | 10-2009-0078631 A | 7/2009 |
| KR | 10-2009-0131404 A | 12/2009 |
| KR | 10-2010-0001598 A | 1/2010 |

* cited by examiner

*Primary Examiner* — Quan-Zhen Wang
*Assistant Examiner* — Tony Davis
(74) *Attorney, Agent, or Firm* — Lee & Morse, P.C.

(57) ABSTRACT

An organic light-emitting display device includes a first sub-pixel, a second sub-pixel, and a third sub-pixel on a substrate. Each of the first, second, and third sub-pixels includes a pixel circuit unit, a first and second pixel electrodes including a reflective film formed of a conductive material that permits light reflection, and a counter electrode that faces the first and second pixel electrodes. The first sub-pixel includes a first organic film between the counter electrode and the first and second pixel electrodes of the first sub-pixel, and includes a red light-emitting layer. The second sub-pixel includes a second organic film between the counter electrode and the first and second pixel electrodes of the second sub-pixel, and includes a green light-emitting layer. The third sub-pixel includes a third organic film between the counter electrode and the first and second pixel electrodes of the third sub-pixel, and includes a blue light-emitting layer.

20 Claims, 9 Drawing Sheets

ORGANIC LIGHT-EMITTING DISPLAY DEVICE

CROSS-REFERENCE TO RELATED PATENT APPLICATION

This application claims the benefit of Korean Patent Application No. 10-2011-0000546, filed on Jan. 4, 2011, in the Korean Intellectual Property Office, and entitled, "Organic Light-Emitting Display Device," the disclosure of which is incorporated herein in its entirety by reference.

BACKGROUND

Embodiments relate to an organic light-emitting display device and to an organic light-emitting display device that is transparent and emits light through both surfaces thereof.

SUMMARY

Embodiments may be realized by providing an organic light-emitting display device that includes a first sub-pixel, a second sub-pixel, and a third sub-pixel formed on a substrate; and a transmission region that is commonly formed on the first sub-pixel, the second sub-pixel, and the third sub-pixel and transmits external light, wherein each of the first through third sub-pixels includes: a pixel circuit unit that is disposed adjacent to the transmission region and comprises at least one thin film transistor (TFT); a first pixel electrode that is electrically connected to the TFT of the pixel circuit unit, overlaps with the pixel circuit unit to cover the TFT, and comprises a reflective film formed of a conductive material that permits light reflection; a second pixel electrode that is disposed in the transmission region, is electrically connected to the first pixel electrode, and is formed of a conductive material that permits light transmission; and a counter electrode that faces the first pixel electrode and the second pixel electrode, wherein the first sub-pixel further comprises a first organic film that is disposed between the first and second pixel electrodes and the counter electrode, and comprises a red light-emitting layer, the second sub-pixel further comprises a second organic film that is disposed between the first and second pixel electrodes and the counter electrode, and comprises a green light-emitting layer, and the third sub-pixel further comprises a third organic film that is disposed between the first and second pixel electrodes and the counter electrode, and comprises a blue light-emitting layer.

An area of the third sub-pixel may be greater than an area of the first sub-pixel or an area of the second sub-pixel.

An area of the second pixel electrode of the third sub-pixel may be greater than an area of the first pixel electrode of the third sub-pixel.

The first sub-pixel, the second sub-pixel, and the third sub-pixel may be sequentially arranged to be parallel to one another, wherein the second pixel electrode of the third sub-pixel is bent toward the first sub-pixel and the second sub-pixel.

The counter electrode may include at least one metal selected from the group consisting of silver (Ag), manganese (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof.

The second pixel electrode may be formed of at least one metal oxide selected from the group consisting of indium tin oxide (ITO), indium zinc oxide (IZO), zinc oxide (ZnO), and $In_2O_3$.

The reflective film may include at least one metal selected from the group consisting of Ag, Mg, Al, Pt, Pd, Au, Ni, Nd, Ir, Cr, Li, Ca, and an alloy thereof.

The organic light-emitting display device may further include a plurality of wires that are electrically connected to the pixel circuit unit, wherein at least one of the plurality of wires overlaps with the first pixel electrode.

The organic light-emitting display device may further include a passivation film that is formed under the first pixel electrode to cover the TFT and is formed of a transparent material.

The organic light-emitting display device may further include a plurality of insulating films that are formed to correspond in position to the transmission region and are each formed of a transparent material.

The organic light-emitting display device may further include a pattern reflective film that is formed along an outer edge of the second pixel electrode in the transmission region and is disposed under the second pixel electrode.

The pattern reflective film may include at least one metal selected from the group consisting of Ag, Mg, Al, Pt, Pd, Au, Ni, Nd, Ir, Cr, Li, Ca, and an alloy thereof.

The organic light-emitting display device may further include a light shielding film that is formed under the TFT of the pixel circuit unit.

Embodiments may also be realized by providing an organic light-emitting display device including a first sub-pixel, a second sub-pixel, and a third sub-pixel formed on a substrate, wherein each of the first through third sub-pixels includes: at least one TFT that is formed on the substrate; a passivation film that covers the TFT; a first pixel electrode that is formed on the passivation film to be electrically connected to the TFT, overlaps with the TFT to cover the TFT, and comprises a reflective film formed of a conductive material that permits light reflection; a second pixel electrode that is formed on the passivation film to be electrically connected to the first pixel electrode, and is formed of a conductive material that permits light transmission; and a counter electrode that faces the first pixel electrode and the second pixel electrode, wherein the first sub-pixel further comprises a first organic film that is disposed between the first and second pixel electrodes and the counter electrode, and comprises a red light-emitting layer, the second sub-pixel further comprises a second organic film that is disposed between the first and second pixel electrodes and the counter electrode, and comprises a green light-emitting layer, and the third sub-pixel further comprises a third organic film that is disposed between the first and second pixel electrodes and the counter electrode, and comprises a blue light-emitting layer.

An area of the third sub-pixel may be greater than an area of the first sub-pixel or an area of the second sub-pixel.

An area of the second pixel electrode of the third sub-pixel may be greater than an area of the first pixel electrode of the third sub-pixel.

The first sub-pixel, the second sub-pixel, and the third sub-pixel may be sequentially arranged to be parallel to one another, wherein the second pixel electrode of the third sub-pixel is bent toward the first sub-pixel and the second sub-pixel.

The organic light-emitting display device may further include a pattern reflective film that is formed along an outer edge of the second pixel electrode and is disposed under the second pixel electrode.

The pattern reflective film may include at least one metal selected from the group consisting of Ag, Mg, Al, Pt, Pd, Au, Ni, Nd, Ir, Cr, Li, Ca, and an alloy thereof.

The organic light-emitting display device may further include a light shielding film that is formed under the TFT.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
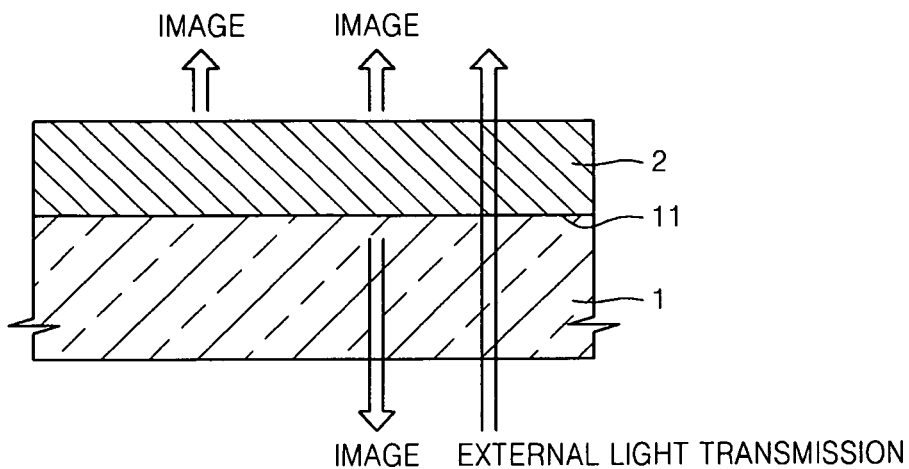
FIG. 1 illustrates a cross-sectional view of an organic light-emitting display device, according to an exemplary embodiment.

Example embodiments will now be described more fully hereinafter with reference to the accompanying drawings. While exemplary embodiments are susceptible to various modifications and alternative forms, specific embodiments thereof are shown by way of example in the drawings and will herein be described in detail. It should be understood, however, that there is no intent to limit embodiments to the particular forms disclosed, but conversely, exemplary embodiments are to cover all modifications, equivalents, and alternatives falling within the spirit and scope of the invention. In the following description, a detailed description of known functions and configurations incorporated herein will be omitted when it may make the subject matter of the exemplary embodiments unclear.

It will be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting of exemplary embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

FIG. 1 illustrates a cross-sectional view of an organic light-emitting display device according to an exemplary embodiment.

Referring to FIG. 1, the organic light-emitting display device may include a substrate 1 and a display unit 2 formed on a first surface 11 of the substrate 1.

External light may pass through the substrate 1 and the display unit 2 of the organic light-emitting display device. The display unit 2 may be a dual emission type in which light is emitted upward and downward, as shown in FIG. 1.

In FIG. 1, the display unit 2 may allow external light to be transmitted therethrough, as will be described later, so that an image on a side opposite to the substrate 1 may be observed by a user who is on a side where the image is created.

Figure 2:
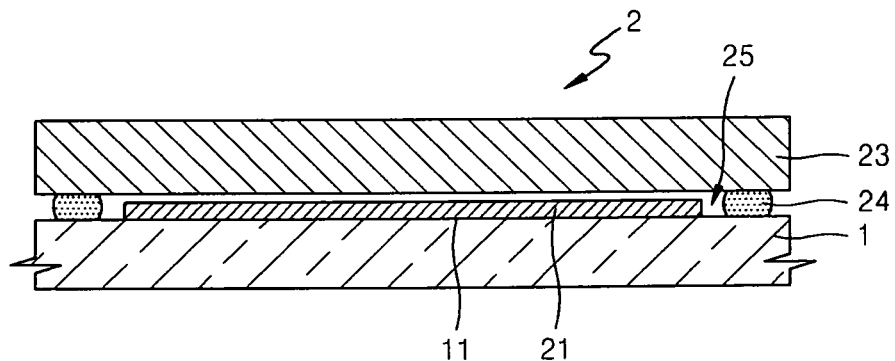
FIG. 2 illustrates an enlarged cross-sectional view of the organic light-emitting display device of FIG. 1.
Figure 3:
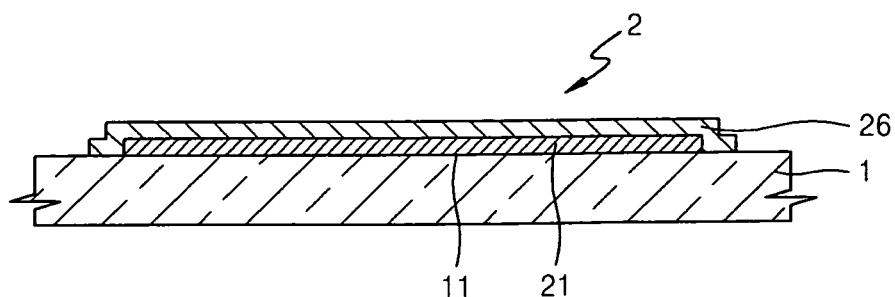
FIG. 3 illustrates a cross-sectional view of an organic light-emitting display device, according to an exemplary embodiment.

FIG. 2 illustrates an enlarged cross-sectional view of the organic light-emitting display device of FIG. 1. FIG. 3 illustrates a cross-sectional view of an organic light-emitting display device according to another exemplary embodiment.

Referring to FIG. 2, the display unit 2 may include an organic light-emitting unit 21 that is formed on the first surface 11 of the substrate 1, and a sealing substrate 23 that seals the organic light-emitting unit 21.

The sealing substrate 23 may be formed of a transparent member, and may allow an image from the organic light-emitting unit 21 to be created thereon. The sealing substrate 23 minimizes and/or prevents external air and moisture from penetrating into the organic light-emitting unit 21.

The substrate 1 and the sealing substrate 23 may be coupled to each other by a sealing member 24 to seal a space 25 between the substrate 1 and the sealing substrate 23. A moisture absorbing material or a filler may be filled in the space 25.

Instead of the sealing substrate 23, a sealing film 26 that is a thin film may be formed on the organic light-emitting unit 21 as shown in FIG. 3, e.g., to protect the organic light-emitting unit 21 from external air. The sealing film 26 may have a structure in which a film formed of an inorganic material such as silicon oxide or silicon nitride, and a film formed of an organic material such as epoxy or polyimide are alternately formed, but the present embodiment is not limited thereto. The sealing film 26 may have any structure if the sealing film 26 is a transparent thin film capable of hermetically protecting the organic light-emitting unit 21 from external air.

Figure 4:
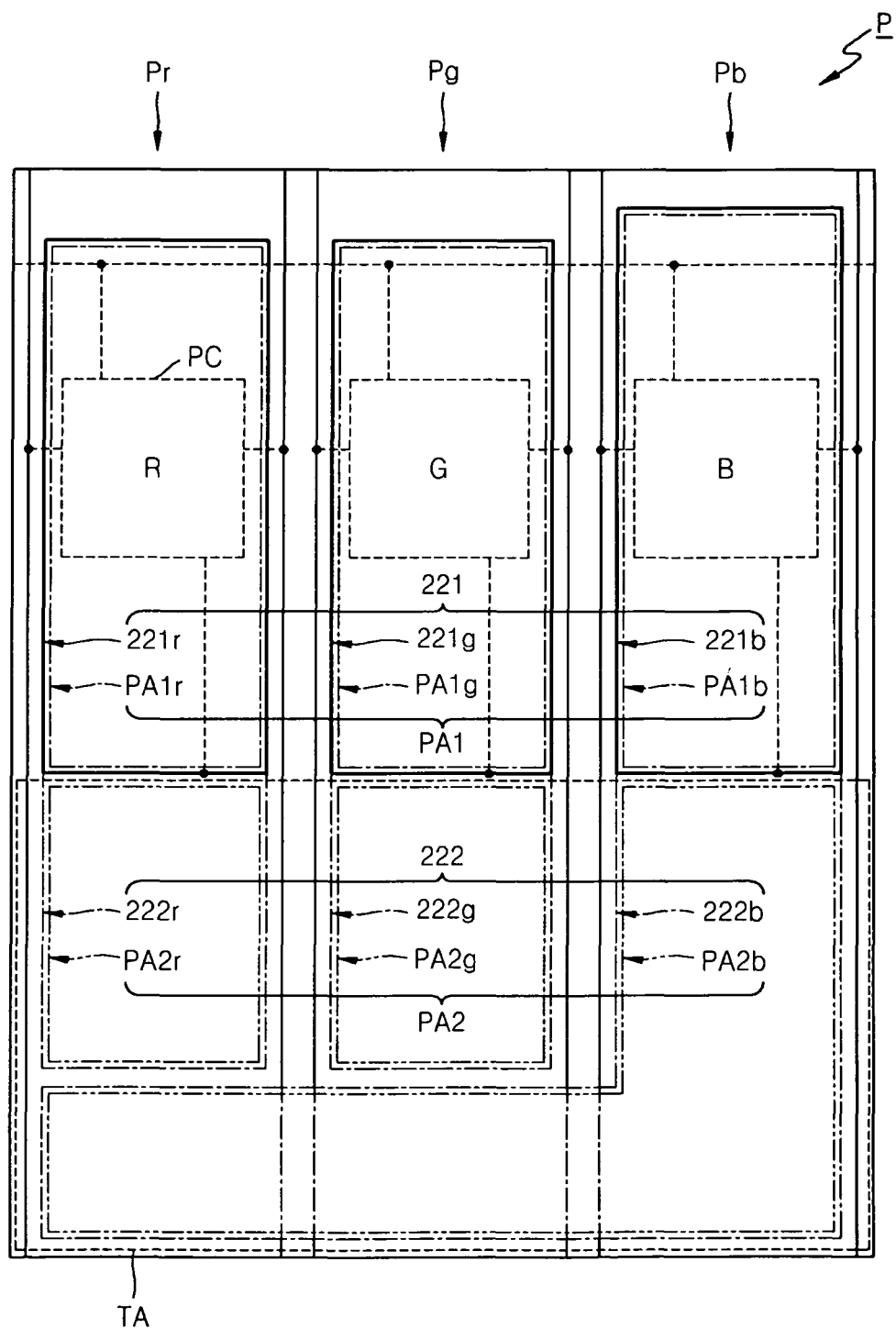
FIG. 4 illustrates a plan view of an organic light-emitting unit of the organic light-emitting display device of FIGS. 2 and 3, according to an exemplary embodiment.
Figure 5:
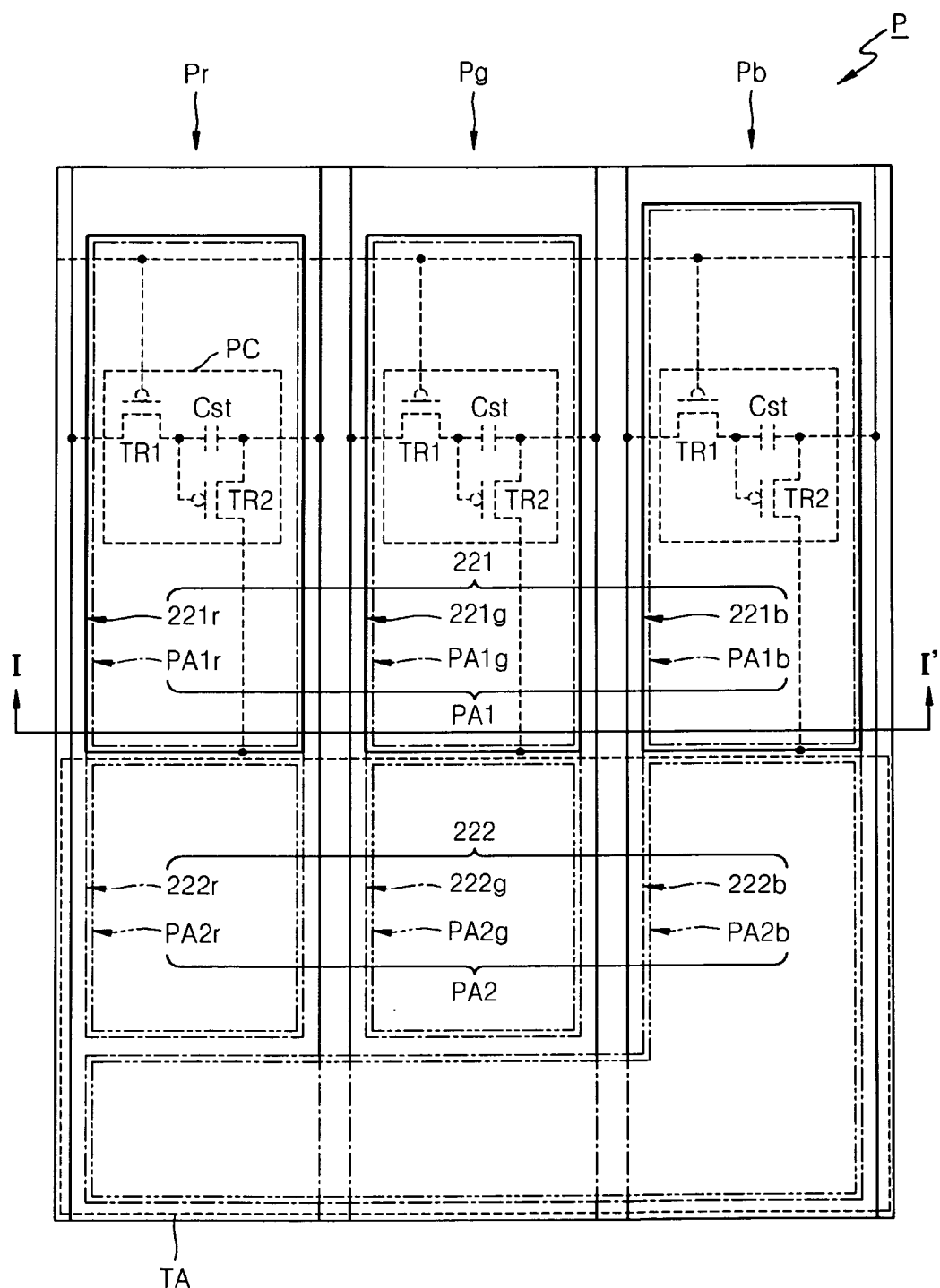
FIG. 5 illustrates a plan view of a pixel circuit unit of the organic light-emitting unit of FIG. 4.

FIG. 4 illustrates a plan view of the organic light-emitting unit 21 of the organic light-emitting display device of FIGS. 2 and 3, according to an exemplary embodiment. FIG. 5 illustrates a plan view of a pixel circuit unit PC of the organic light-emitting unit 21 of FIG. 4.

Referring to FIGS. 4 and 5, the organic light-emitting unit 21 may include a plurality of unit pixels P, and each of the plurality of unit pixels P may include at least a first sub-pixel Pr, a second sub-pixel Pg, and a third sub-pixel Pb. According to an exemplary embodiment, the first sub-pixel Pr may be a red sub-pixel, the second sub-pixel Pg may be a green sub-pixel, and the third sub-pixel Pb may be a blue sub-pixel. However, embodiments are not limited thereto, e.g., the plurality of unit pixels P may include additional pixel colors.

The first through third sub-pixels Pr, Pg, and Pb may share a transmission region TA through which external light is transmitted, and may each include a first pixel region PA1 adjacent to the transmission region TA. A second pixel region PA2 may be adjacent to the first pixel region PA1 and may be located in at least a part of the transmission region TA.

The first pixel region PA1 may be an area that permits top emission. An organic film 223 disposed between a first pixel electrode 221 and a counter electrode 224 may emit light in the first pixel region PA1. As such, the first pixel region PA1 may be defined by the first pixel electrode 221. The first pixel electrode 221 may include a reflective film such that top emission with high outcoupling efficiency may occur in the first pixel region PA1.

The second pixel region PA2 may be an area that permits external light transmission and dual emission. Likewise, the second pixel region PA2 may be defined by a second pixel electrode 222. The second pixel electrode 222 may be formed of a transparent material and may be disposed in the transmission region TA, such that the second pixel region PA2 permits external light transmission and dual emission.

The transmission region TA may be shared by the first sub-pixel Pr, the second sub-pixel Pg, and the third sub-pixel Pb in the unit pixel P. However, the embodiments are not limited thereto, e.g., the transmission region TA may be independently formed in each of the first through third sub-pixels Pr, Pg, and Pb.

As shown in FIG. 4, the pixel circuit unit PC may be disposed in the first pixel region PA1, e.g., of each of the first through third sub-pixels Pr, Pg, and Pb. A plurality of conductive lines such as a scan line S, a data line D, and a Vdd line V may be electrically connected to the pixel circuit unit PC. Although not shown, various conductive lines other than the scan line S, the data line D, and the VDD line V that is a driving power supply may be included in the pixel circuit unit PC.

As shown in FIG. 5, the pixel circuit unit PC may include a first thin film transistor (TFT) TR1 connected to the scan line S and the data line D, a second TFT TR2 connected to the first TFT TR1 and the Vdd line V, and a capacitor Cst connected to the first TFT TR1 and the second TFT TR2. The first TFT TR1 may become a switching transistor, and the second TFT TR2 may become a driving transistor. The second TFT TR2 may be electrically connected to the first pixel electrode 221. The numbers of TFTs and capacitors are not limited thereto, e.g., more than two TFTs and more than one capacitor may be used according to a design of the pixel circuit unit PC.

Referring to FIGS. 4 and 5, the first pixel electrode 221 may overlap with the pixel circuit unit PC to, e.g., cover the pixel circuit unit PC. At least some of the scan line S, the data line D, and the Vdd line V may overlap with the first pixel electrode 221. However, the embodiments are not limited thereto. For example, at least one of the plurality of conductive lines including the scan line S, the data line D, and the Vdd line V may overlap with the first pixel electrode 221. All of the plurality of conductive lines including the scan line S, the data line D, and the Vdd line V may be located beside the first pixel electrode 221.

According to an exemplary embodiment, top emission with high outcoupling efficiency may occur in the first pixel region PA1 of each of the first through third sub-pixels Pr, Pg, and Pb. Since the pixel circuit unit PC may be located in the first pixel region where top emission occurs, a user may see through the transmission region TA of the first through third sub-pixels Pr, Pg, and Pb. That is, since a conductive pattern of the pixel circuit unit PC which is the largest obstructer of transmission is not located in the transmission region TA, a transmittance of the transmission region TA may be increased.

The organic light-emitting unit 21 for creating an image includes the first pixel region PA1 and the second pixel region PA2. The pixel circuit unit PC and conductive patterns may be located in the first pixel region PA1, and the second pixel region PA2 may be formed in the transmission region TA. Accordingly, since the pixel circuit unit PC that may reduce an external light transmittance and the conductive patterns are not located in the transmission region TA, a transmittance may be increased. As a result, a transmittance of the organic light-emitting unit 21 of FIGS. 2 and 3, which may create an image, may be increased to be higher than that of a conventional transparent display device. The conductive lines including the scan line S, the data line D, and the Vdd line V may cross part of the second pixel region PA2 and the transmission region TA. However, since the conductive lines are very thin, they have little effect on an overall transmittance of the organic light-emitting unit 21, thereby enabling realization of a transparent display device.

The first pixel electrode 221 electrically connected to the pixel circuit unit PC may be located in the first pixel region PA1. The pixel circuit unit PC may overlap with the first pixel electrode 221 to be covered by the first pixel electrode 221. At least one of the conductive lines including the scan line S, the data line D, and the Vdd line V may pass through the first pixel electrode 221. Since the conductive lines may rarely reduce a transmittance when compared with the pixel circuit unit PC, the conductive lines may be located adjacent to the first pixel electrode 221 according to design conditions. Since the first pixel electrode 221 may include the reflective film formed of a conductive metal that permits light reflection, as will be described later, the first pixel electrode 221 may cover the pixel circuit unit PC, and reduce and/or prevent external image distortion due to the pixel circuit unit PC in the first pixel region PA1.

The second pixel electrode 222 may be located in the transmission region TA to form the second pixel region PA2. The second pixel electrode 222 may be formed of a metal oxide that permits light transmission, as will be described later, such that eternal light may be transmitted through the second pixel region PA2.

The counter electrode 224 may be formed to face, e.g., entirely face, the first pixel electrode 221 and the second pixel electrode 222 of each of the first through third sub-pixels Pr, Pg, and Pb. The counter electrode 224 may be formed of a material that, e.g., permits both light reflection and light transmission, and may be formed over the first pixel region PA1, the second pixel region PA2, and the transmission region TA.

Figure 6:
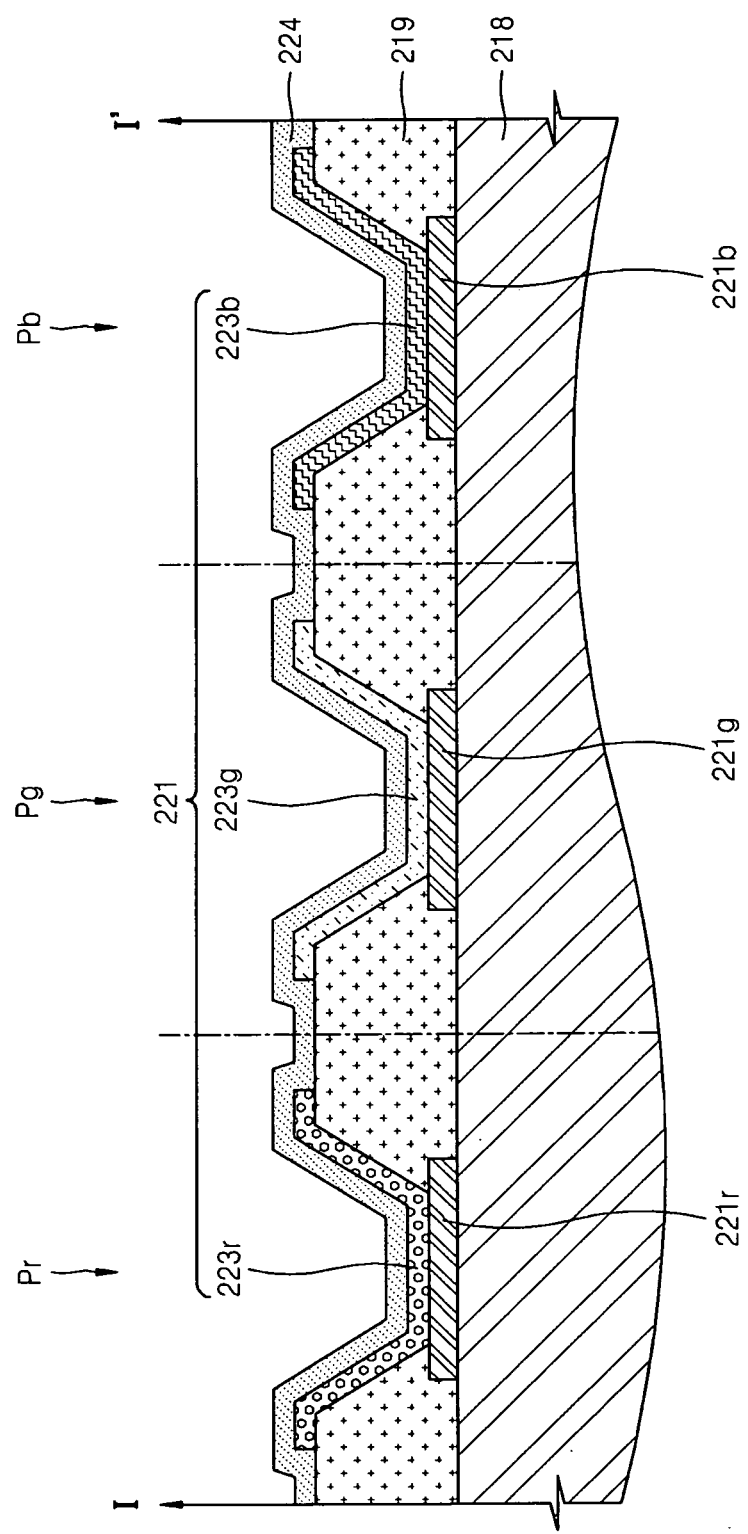
FIG. 6 illustrates a cross-sectional view taken along line I-I' of FIG. 5.

FIG. 6 illustrates a cross-sectional view taken along line I-I' of FIG. 5.

Referring to FIG. 6, the first sub-pixel Pr may include a first organic film 223r that is disposed between first and second pixel electrodes 221r and 222r and the counter electrode 224 of the first sub-pixel Pr, and may include a red light-emitting layer. The second sub-pixel Pg may include a second organic film 223g that is disposed between first and second pixel electrodes 221g and 222g and the counter electrode 224 of the second sub-pixel Pg, and may include a green light-emitting layer. The third sub-pixel Pb may include a third organic film 223b that is disposed between first and second pixel electrodes 221b and 222b and the counter electrode 224 of the third sub-pixel Pb, and may include a blue light-emitting layer.

For convenience of explanation in FIG. 6, the first through third organic films 223r, 223g, and 223b, which are collectively denoted by reference numeral 223, are illustrated by focusing on their light-emitting layers respectively formed in the first through third sub-pixels Pr, Pg, and Pb. In this regard, a hole injection layer (HIL), a hole transport layer (HTL), an electron transport layer (ETL), an electron injection layer (EIL), and like structures, which may be commonly formed in the first through third sub-pixels Pr, Pg, and Pb, are not shown.

According to an exemplary embodiment, an area of the third sub-pixel Pb may be greater than an area of the first sub-pixel Pr or an area of the second sub-pixel Pg. A total area of a first pixel region PA1b and a second pixel region PA2b of the third sub-pixel Pb may be greater than a total area of a first pixel region PA1r and a second pixel region PA2r of the first sub-pixel Pr. The total area of the first pixel region PA1b and the second pixel region PA2b of the third sub-pixel Pb may be greater than a total area of a first pixel region PA1g and a second pixel region PA2g of the second sub-pixel Pg.

Without intending to be bound by this theory, the third organic film 223b, which may include the blue light-emitting layer of the third sub-pixel Pb, may have a shorter lifetime than the first organic film 223r and the second organic film 223g. Accordingly, an overall lifetime of the organic light-emitting unit 21 may be extended by making the area of the third sub-pixel Pb, which is a blue sub-pixel, greater than the area of any of the other sub-pixels, that is, the first and second sub-pixels Pr and Pg. For example, the third sub-pixel Pb may be designed to be about 120 to 150% larger than the first and second sub-pixels Pr and Pg.

An area of the second pixel electrode 222b of the third sub-pixel Pb may be greater than an area of the first pixel electrode 221b of the third sub-pixel Pb. The second sub-pixel 222b of the third sub-pixel Pb may be bent toward the first sub-pixel Pr and the second sub-pixel Pg so that the area of the second pixel electrode 222b of the third sub-pixel Pb is greater than the area of the first pixel electrode 221b of the third sub-pixel Pb. As described above, the first pixel electrode 221 may define the first pixel region PA1, and the second pixel electrode 222 may define the second pixel region PA2. Accordingly, an area of the second pixel region PA2b of the third sub-pixel Pb may be greater than an area of the first pixel region PA1b of the third sub-pixel Pb.

Top emission with high outcoupling efficiency may occur in the first pixel region PA1 due to, e.g., the first pixel electrode 221 including the reflective film. Dual emission occurs in the second pixel region PA2 due to, e.g., the second pixel electrode 222 through which light is transmitted. Accordingly, a dual emission area of the third sub-pixel Pb may be greater than a top emission area. There is a difference in color change value between a dual emission area and a top emission area of a unit pixel. However, since the dual emission area of the third sub-pixel Pb may be greater than the top emission area in the present embodiment, color coordinates are shifted, and thus the top emission area and the dual emission area of the unit pixel P may have a similar color change value.

An area of the second pixel region PA2b of the third sub-pixel Pb may be about 140 to 155% greater than that of each of the second pixel regions PA2r and PA2g of the first and second sub-pixels Pr and Pg, respectively. An area of the first pixel region PA1b of the third sub-pixel Pb may be about 120 to 135% greater than that of each of the first pixel regions PA1r and PA1g of the first and second sub-pixels Pr and Pg, respectively.

Based on experiments, according to an exemplary embodiment, an area of the second pixel region PA2b of the third sub-pixel Pb is about 148% greater than that of each of the second pixel regions PA2r and PA2g of the first and second sub-pixels Pr and Pg, respectively, and an area of the first pixel region PA1b of the third sub-pixel Pb is about 127% greater than that of each of the first pixel regions PA1r and PA1g of the first and second sub-pixels Pr and Pg, respectively. In this case, the top emission area and the dual emission area of the unit pixel P may have a similar color change value.

Here, a color change value refers to a gradient of chroma (u, v) measured for about 240 hours at a brightness of about 250 nits.

Examining results of one of the experiments, in the first pixel region PA1 that is the top emission area, when the first pixel region PA1r of the first sub-pixel Pr has an area of 16.5 um$^2$, the first pixel region PA1g of the second sub-pixel Pg has an area of 16.5 um$^2$, and the first pixel region PA1b of the third sub-pixel Pb has an area of 21 um$^2$, a color change value is 0.0040. However, when the areas of the first pixel regions PA1r, PA1g, and PA1b of the first through third sub-pixels Pr, Pg, and Pb, respectively, are applied to the second pixel region PA2 that is the dual emission area, a color change value is 0.0044 that is quite different from 0.0040.

Accordingly, in order to make a color change value in the dual emission area similar to that in the top emission area, the area of the second pixel region PA2b of the third sub-pixel Pb should be increased. According to an exemplary embodiment, the second pixel region PA2b of the third sub-pixel Pb may be bent toward the first sub-pixel Pr and the second sub-pixel Pg, and the areas of the second pixel regions PA2r and PA2g of the first sub-pixel Pr and the second sub-pixel Pg may be reduced. For example, when the second pixel region PA2r of the first sub-pixel Pr has an area of 15.5 um$^2$, the second pixel region PA2g of the second sub-pixel Pg has an area of 15.5 um$^2$, and the second pixel PA2b of the third sub-pixel Pg has an area 23 um$^2$, a color change value is 0.0039 that is similar to that in the top emission area.

In particular, since the second pixel electrode 222b of the third sub-pixel Pb may be bent, the area of the second pixel electrode 222b of the third sub-pixel Pb and the second pixel region PA2b of the third sub-pixel Pb, which may be the largest in a limited space of the unit pixel P, may be achieved. In the unit pixel P, a point light source may be macroscopically. For example, if the third sub-pixel Pb is bent, and more light may be emitted at an edge of the unit pixel P, and light may be emitted more efficiently.

Figure 7:
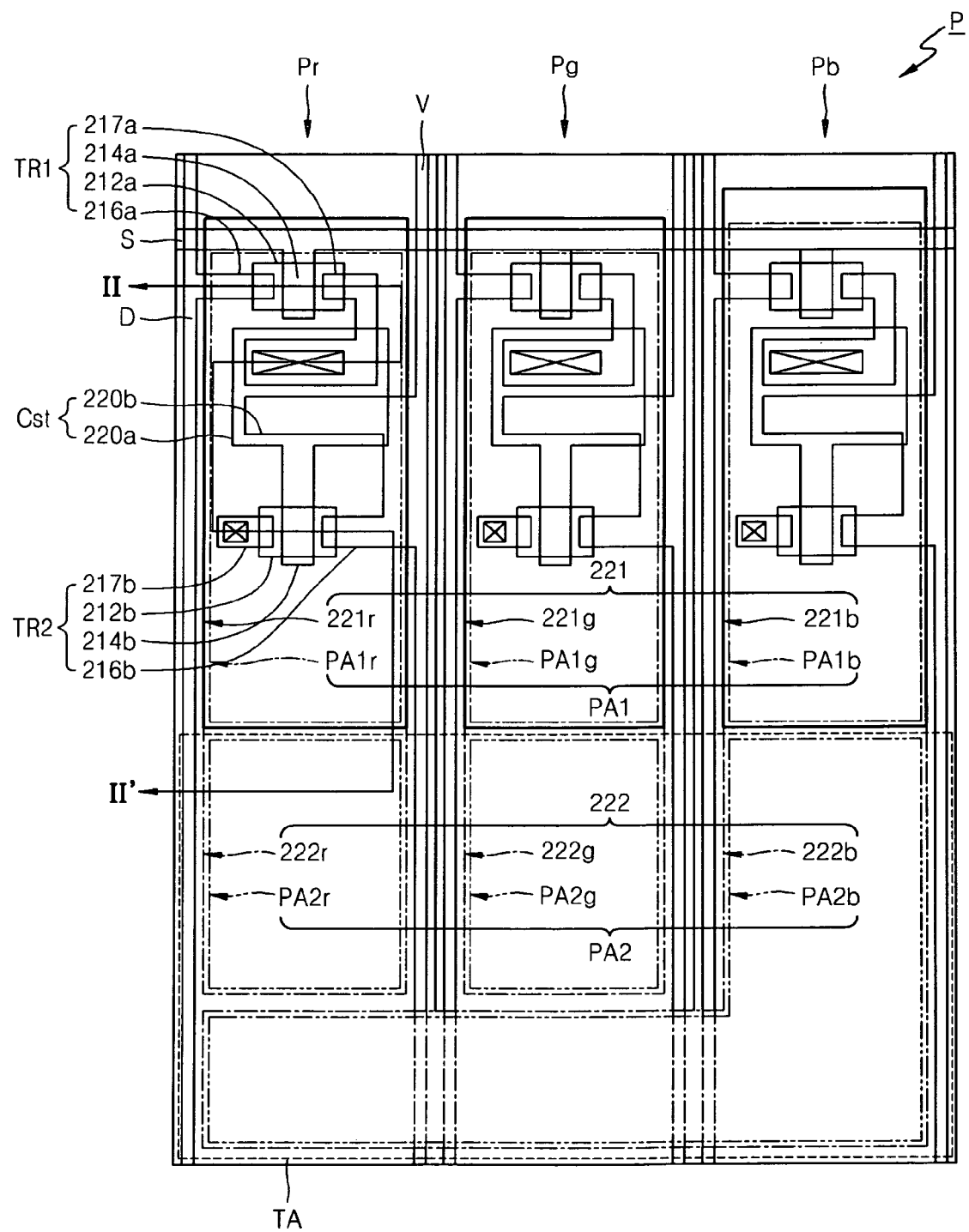
FIG. 7 illustrates a plan view for explaining the organic light-emitting unit of FIG. 5.
Figure 8:
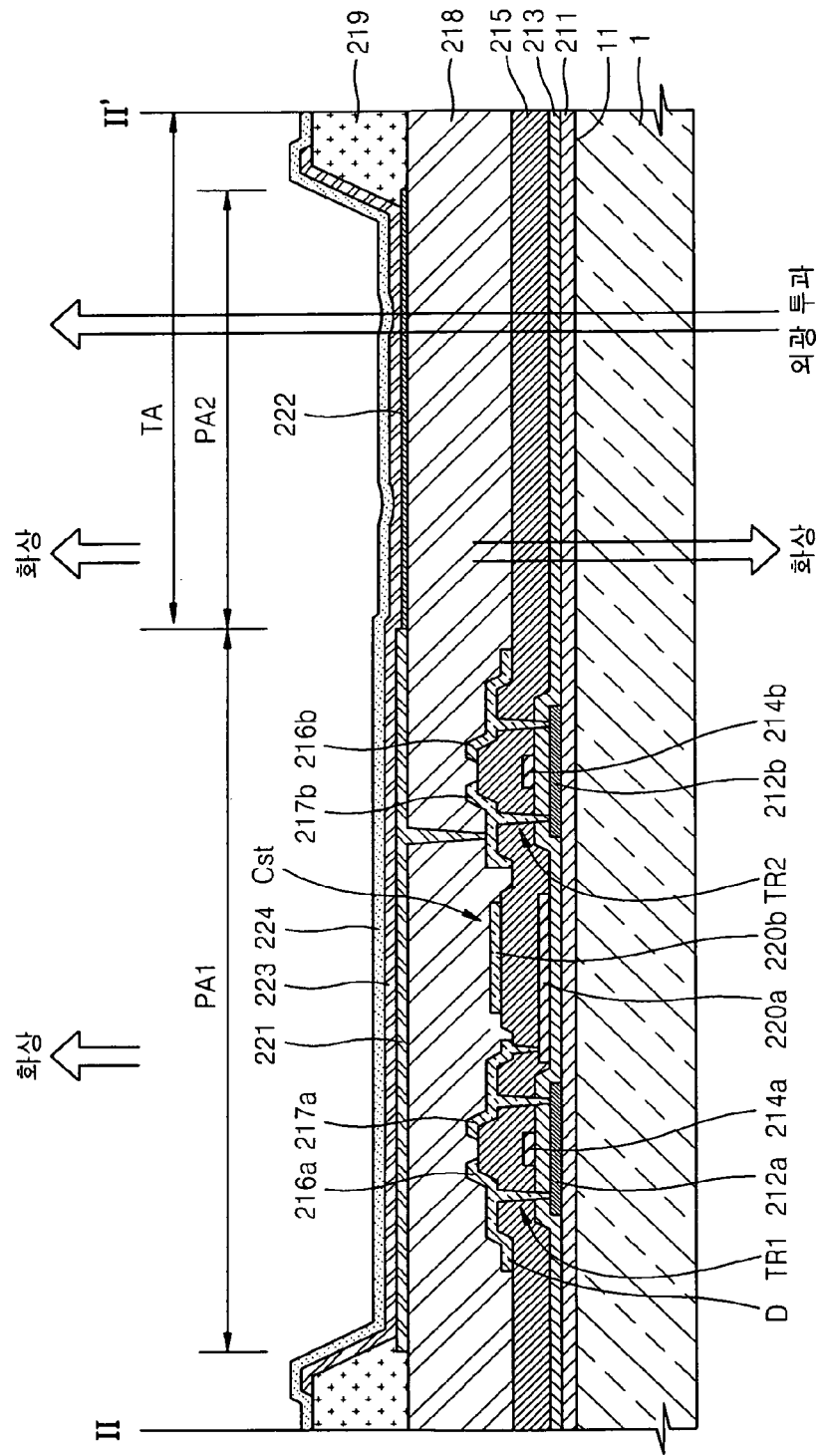
FIG. 8 illustrates a cross-sectional view taken along line II-II' of FIG. 7.

FIG. 7 illustrates a plan view for explaining the organic light-emitting unit 21 of FIG. 5. FIG. 8 illustrates a cross-sectional view taken along line II-II' of FIG. 7, illustrating the first sub-pixel Pr. In FIG. 8, reference numerals of elements are not limited to the first sub-pixel Pr and are commonly used ones. This is because each of the second sub-pixel Pg and the third sub-pixel Pb may have the same cross-section, in the relevant area, as that of the first sub-pixel Pr. The same goes to FIGS. 9 through 12.

Referring to FIGS. 7 and 8, a buffer film 211 may be formed on the first surface 11 of the substrate 1. The first TFT TR1, the capacitor Cst, and the second TFT TR2 may be formed on the buffer film 211.

A first semiconductor active layer 212a and a second semiconductor active layer 212b may be formed on the buffer film 211.

The buffer film 211 may minimize and/or prevent penetration of impurity elements and may planarize a surface of the substrate 1. The buffer film 211 may be formed of any of various materials that may perform the functions described above. For example, the buffer film 211 may include at least one of an inorganic material that includes silicon oxide, silicon nitride, silicon oxynitride, aluminium oxide, aluminium nitride, titanium oxide, or titanium nitride, and/or at least one organic material that includes polyimide, polyester, or acryl. The buffer film 211 may include stacks of all of the above materials. The buffer film 211 may be omitted.

Each of the first semiconductor active layer 212a and the second semiconductor active layer 212b may be formed of polycrystalline silicon, but the embodiments are not limited thereto, e.g., first and second semiconductor active layers 212a and 212b may be formed of an oxide semiconductor. For example, each of the first semiconductor active layer 212a and the second semiconductor active layer 212b may be a $(In_2O_3)a(Ga_2O_3)b(ZnO)c$ (G-I—Z—O) layer (a, b, and c may be real numbers respectively satisfying a≥0, b≥0, and c≥0).

A gate insulating film 213 may be formed over the buffer film 211 to cover the first semiconductor active layer 212a and the second semiconductor active layer 212b. A first gate electrode 214a and a second gate electrode 214b may be formed on the gate insulating film 213.

An interlayer insulating film 215 may be formed on the gate insulating film 213 to cover the first gate electrode 214a and the second gate electrode 214b. A first source electrode 216a and a first drain electrode 217a, and a second source electrode 216b and a second drain electrode 217b may be formed on the interlayer insulating film 215 to contact the first semiconductor active layer 212a and the second semiconductor active layer 212b, respectively, through contact holes.

In FIG. 8, the scan line S may be formed at the same time as the first gate electrode 214a and the second gate electrode 214b are formed. The data line D may be formed at the same time as the first source electrode 216a is formed, to be connected to the first source electrode 216a. The Vdd line V may be formed at the same time as the second source electrode 216b is formed, to be connected to the second source electrode 216b.

As for the capacitor Cst, a lower electrode 220a may be formed at the same time as the first gate electrode 214a and the second gate electrode 214b are formed, and an upper electrode 220b may be formed at the same time as the first drain electrode 217a is formed.

Structures of the first TFT TR1, the capacitor Cst, and the second TFT TR2 are not limited thereto, and the first TFT TR1, the capacitor Cst, and the second TFT TR2 may have various other structures. For example, although the first TFT TR1 and the second TFT TR2 have a top gate structure in FIGS. 7 and 8, the first gate electrode 214a and the second gate electrode 214b may have a bottom gate structure such that the first gate electrode 214a and the second gate electrode 214b are disposed under the first semiconductor active layer 212a and the second semiconductor active layer 212b, respectively. The structures of the first and second TFT TR1 and TR2 are not limited thereto, e.g., the first and second TFT TR1 and TR2 may have any of other structures.

A passivation film 218 may be formed to cover the first TFT TR1, the capacitor Cst, and the second TFT TR2. The passivation film 218 may be an insulating film including a single layer or a plurality of layers whose top surfaces are planarized. The passivation film 218 may be formed of an inorganic material and/or an organic material.

As shown in FIGS. 7 and 8, the first pixel electrode 221 may be formed on the passivation film 218 to cover the first TFT TR1, the capacitor Cst, and the second TFT TR2. The first pixel electrode 221 may be connected to the second drain electrode 217b of the second TFT TR2 due to a via hole formed in the passivation film 218.

The second pixel electrode 222 may be formed on the passivation film 218 to be located adjacent to the first pixel electrode 221. The first pixel electrode 221 and the second pixel electrode 222 may be connected to each other.

A pixel defining film 219 may be formed on the passivation film 218 to cover edges of the first pixel electrode 221 and the second pixel electrode 222. The organic film 223 and the counter electrode 224 may be sequentially stacked on the first pixel electrode 221. The counter electrode 224 may be formed over the transmission region TA and the first and second pixel regions PA1 and PA2.

The organic film 223 may be a low molecular weight organic film or a high molecular weight organic film. If the organic film 223 is a low molecular weight organic film, the organic film 223 may be formed by stacking an HIL, an HTL, an EML, an ETL, and an EIL, and each of the layers may have a single or multi-layered structure. The organic film 223 may be formed of any of various materials such as copper phthalocyanine (CuPc), N,N'-Di(naphthalene-1-yl)-N,N'-diphenyl-benzidine (NPB), and tris-8-hydroxyquinoline aluminum (Alq3). The low molecular weight organic film may be formed by a deposition process, e.g., by using vacuum deposition.

The EML may be independently formed for each of the first sub-pixel Pr that is a red pixel, the second sub-pixel Pg that is a green pixel, and the third sub-pixel Pb that is a blue pixel. The HIL, the HTL, the ETL, and the EIL may be commonly formed in the first sub-pixel Pr, the second sub-pixel Pg, and the third sub-pixel Pb. As shown in FIG. 8, the HIL, the HTL, the ETL, and the EIL may be formed to cover the first and second pixel regions PA1 and PA2 and the transmission region TA, like the counter electrode 224.

The first pixel electrode 221 and the second pixel electrode 222 may act as anodes, and the counter electrode 224 may act as a cathode. The first pixel electrode 221 and the second pixel electrode 222 may act as cathodes, and the counter electrode 224 may act as an anode.

The first pixel electrode 221 may be formed to have a size corresponding to that of the first pixel region PA1 in each pixel. The second pixel electrode 222 may be formed to have a size corresponding to that of the second pixel region PA2 in each pixel. The counter electrode 224 may be formed as a common electrode to cover all pixels of the organic light-emitting unit 21.

According to the present embodiment, the first pixel electrode 221 may be an electrode including a reflective film, and the counter electrode 2254 may be a semi-transmissive and semi-reflective electrode. Accordingly, the first pixel region PA1 is a top emission type in which an image is created toward the counter electrode 224.

The first pixel electrode 221 may include a reflective film formed of at least one of silver (Ag), manganese (Mg), aluminum (Al), platinum (Pt), palladium (Pd), gold (Au), nickel (Ni), neodymium (Nd), iridium (Ir), chromium (Cr), lithium (Li), calcium (Ca), or a compound thereof, or an oxide having a high work function such as indium tin oxide (ITO), indium zinc oxide (IZO), zinc oxide (ZnO), or $In_2O_3$. The counter electrode 224 may be formed of a metal having a low work function, that is, e.g., Ag, Mg, Al, Pt, Pd, Au, Ni, Nd, Ir, Cr, Li, Ca, or an alloy thereof. The counter electrode 224 may be formed of a thin film having a thickness of about 100 to bout 300 Å in order to have a high transmittance. A transparent protective film may be further disposed on the counter electrode 224.

If the first pixel electrode 221 is a reflective electrode, the pixel circuit unit PC disposed under the first pixel electrode 221 may be covered by the first pixel electrode 221. Thus, referring to FIG. 8, patterns of the first TFT TR1, the capacitor Cst, and the second TFT TR2 under the first pixel electrode 221 may not be observed by the user outside the counter electrode 224.

The first pixel electrode 221 may be a reflective electrode, and thus light may be scattered only to an observer, and the amount of light lost in a direction opposite to the observer may be reduced. As described above, since the first pixel electrode 221 covers various patterns of the pixel circuit unit PC disposed under the first pixel electrode 221, the observer may see a clear image.

Meanwhile, the second pixel electrode 222 may be a transparent electrode. In this case, the second pixel electrode 222 may be formed of an oxide having a high work function such as ITO, IZO, ZnO, or $In_2O_3$ without a reflective film. Since the second pixel electrode 222 may be transparent, the user outside the counter electrode 224 may observe an image formed under the substrate 1 through the second pixel region PA2.

The second pixel electrode 222 may be formed at the same time as the first pixel electrode 221 is formed. The second pixel electrode 222 may be formed by extending a transparent metal oxide layer, not a reflective film, of the pixel electrode 221 to a location where the second pixel electrode 222 is to be formed.

The passivation film 218, the gate insulating film 213, the interlayer insulating film 215, and the pixel defining film 219 may be formed as transparent insulating films. In this case, the substrate 1 may have a transmittance that is less than or equal to an overall transmittance of the insulating films.

Figure 9:
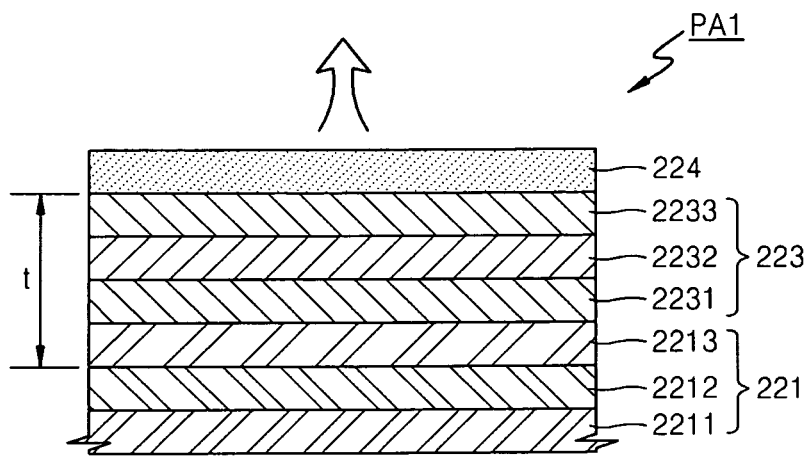
FIG. 9 illustrates a cross-sectional view of a first pixel region of FIG. 8.
Figure 10:
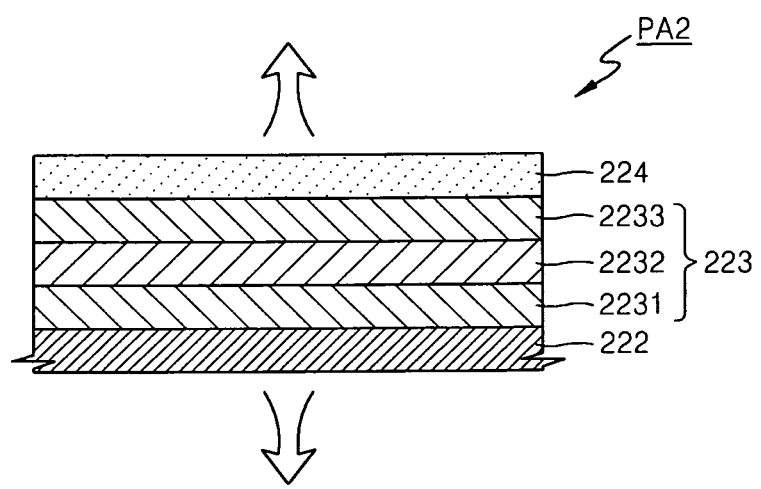
FIG. 10 illustrates a cross-sectional view of a second pixel region of FIG. 8.

FIG. 9 illustrates a cross-sectional view of the first pixel region PA1 of FIG. 8. FIG. 10 illustrates a cross-sectional view of the second pixel region PA2 of FIG. 8.

The first pixel electrode 221 may have a structure in which a first transparent conductive film 2211, a reflective film 2212, and a second transparent conductive film 2213 are stacked. Each of the first transparent conductive film 2211 and the second transparent conductive film 2213 may be formed of an oxide having a high work function such as ITO, IZO, ZnO, or $In_2O_3$. The reflective film 2212 may be formed of Ag, Mg, Al, Pt, Pd, Au, Ni, Nd, Ir, Cr, Li, Ca, or a compound thereof.

The organic film 223 having a structure in which a first functional layer 2231, a light-emitting layer 2232, and a second functional layer 2233 are stacked may be formed on the first pixel electrode 221, and the counter electrode 224 may be formed on the organic film 223. The first functional layer 2231 may include an HIL and an HTL, and the second functional layer 2233 may include an EIL and an ETL.

In this case, a distance 't' between a surface of the reflective film 2212 and the counter electrode 224 is adjusted to cause optical resonance according to the wavelength of light emitted from the light-emitting layer 2232. Accordingly, the distance 't' may vary according to sub-pixels, i.e., according to whether a current pixel is the first sub-pixel Pr, the second sub-pixel Pg, or the third sub-pixel Pb which have different organic films.

The first pixel region PA1 may be a top emission type in which an image is created toward the counter electrode 224. Outcoupling efficiency may be maximized by adjusting the distance T to cause optical resonance.

The second pixel electrode 222 may not include a reflective film and may be formed of only a transparent conductive material as described above. Accordingly, the second pixel electrode 222 may be formed by directly extending at least one of the first transparent conductive film 2211 and the second transparent conductive film 2213 of the first pixel electrode 221 to a location where the second pixel electrode 222 is to be formed.

The organic film 223 having a structure in which the first functional layer 2231, the light-emitting layer 2232, and the second functional layer 2233 are stacked may be formed on the second pixel electrode 222, and the counter electrode 224 may be formed on the organic film 223.

Since the second pixel electrode 222 has no reflective film in the second pixel region PA2, the distance 't' may not need to be adjusted to cause optical resonance. Also, the second pixel electrode area PA2 may be a dual emission type in which an image is created toward the counter electrode 224 and the second pixel electrode 222. Accordingly, when the display unit 2 operates, the second pixel region PA2 is a dual emission type to create an image, and when the display unit 2 does not operate, the second pixel region PA2 may be a type through which an external image is transmitted. Also, since the second pixel region PA2 does not use optical resonance, outcoupling efficiency may be reduced. Accordingly, even when the display unit 2 operates, a faint transmitted image may be observed by the user through the second pixel region PA2.

Accordingly, if the user is located above the counter electrode 224, even while the display unit 2 operates, the user may observe a clear and bright image with high outcoupling efficiency through the first pixel region PA1, and may also observe a faint transmitted image through the second pixel region PA2.

Figure 11:
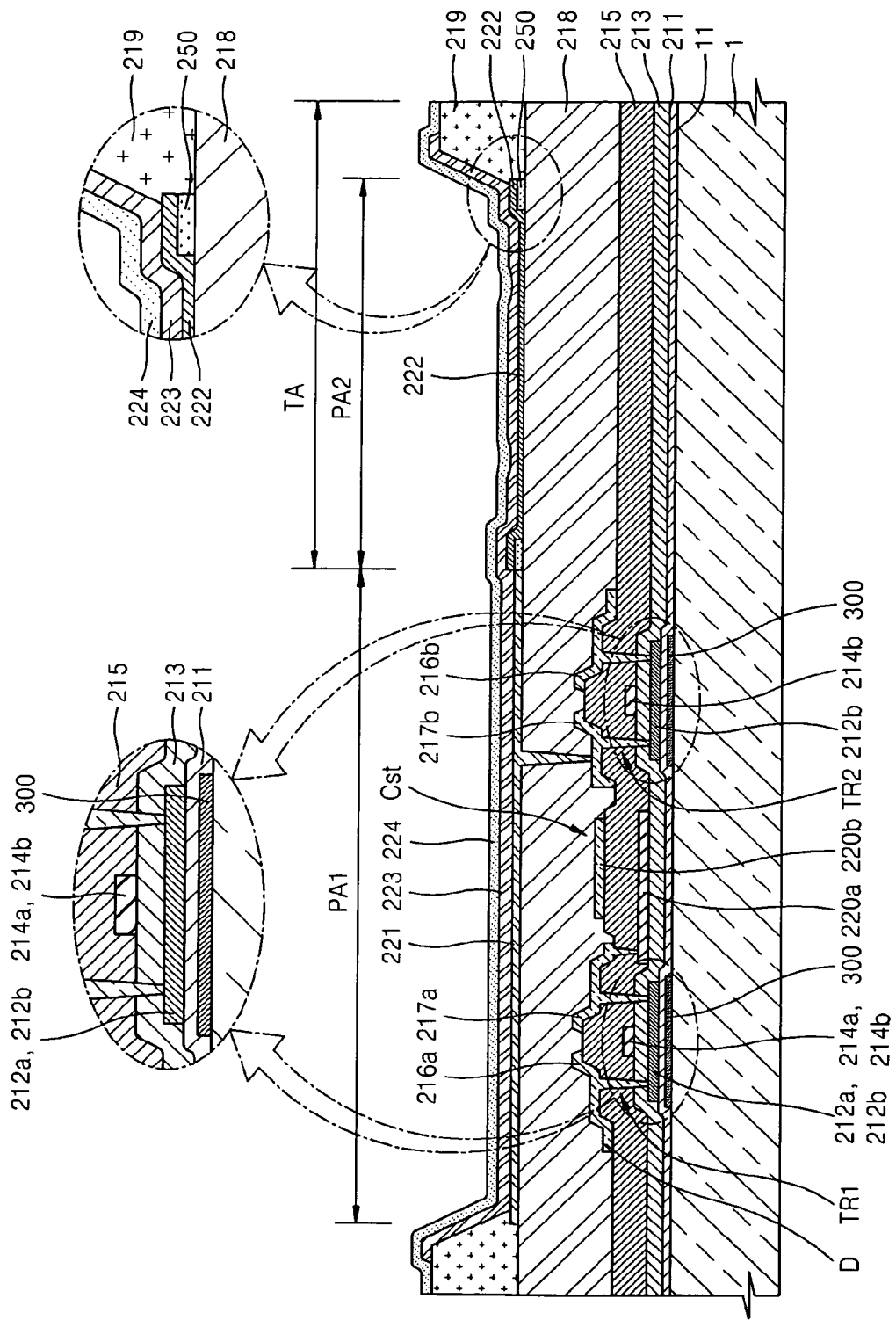
FIG. 11 illustrates a cross-sectional view of the organic light-emitting unit, according to an exemplary embodiment.

FIG. 11 illustrates a cross-sectional view of the organic light-emitting unit 21 according to another exemplary embodiment.

When compared with the organic light-emitting unit 21 of FIG. 8, a light shielding film 300 may be formed under the first and second TFTs TR1 and TR2. Also, a pattern reflective film 250 may be formed under the second pixel electrode 222 along an outer edge of the second pixel electrode 222, unlike in FIG. 8.

Referring to FIG. 11, the light shielding film 300 may be formed under the first semiconductor active layer 212a of the first TFT TR1 and under the second semiconductor active layer 212b of the second TFT TR2. Although the light shielding film 300 may be formed under the buffer layer 211 in FIG. 11, the present embodiment is not limited thereto. For example, the light shielding film 300 may be formed over the buffer layer 211, and an additional insulating film may be formed between the light shielding film 300 and the first and second semiconductor active layers 212a and 212b. Since the light shielding film 300 may be formed under the TFT of the pixel circuit unit PC, the light shielding film 300 may be formed in the first pixel region PA1. If necessary, the light shielding film 300 may be formed under the capacitor Cst, not under the TFT, in the first pixel region PA1. The light shielding film 300 may be formed in the first pixel region PA1 that permits top emission, is included in the transmission region TA, and is not formed in the second pixel region PA2 that permits dual emission. The light shielding film 300 may be formed of a material having a low reflectance, e.g., a black matrix.

Since various wires and structures including a semiconductor active layer used to form a TFT may reflect external light, reflected light exists when an organic light-emitting display device is turned off. Such reflective light decreases external light visibility. However, when the light shielding film 300 is formed, external light may be protected and/or prevented from being reflected, thereby improving external light visibility. Also, since the light shielding film 300 may be formed only in the first pixel region PA1 that permits top emission, a transmittance of the organic light-emitting display device may not be reduced.

Referring to FIG. 11, the pattern reflective film 250 may be formed under the second pixel electrode 222 along the outer edge of the second pixel electrode 222. That is, the pattern reflective film 250 may be formed in the second pixel region PA2 that permits dual emission. The pattern reflective film 250 may include at least one metal selected from the group consisting of Ag, Mg, Al, Pt, Pd, Au, Ni, Nd, Ir, Cr, Li, Ca, and an alloy thereof.

Since the pattern reflective film 250 may be formed under the second pixel electrode 222 along the outer edge of the second pixel electrode 222, the outer edge of the second pixel electrode 222 may be a top emission type, thereby maximizing outcoupling efficiency.

Meanwhile, the second pixel electrode 222 may be formed as a thin film and may be formed of at least one transparent metal oxide selected form the group consisting of ITO, IZO, ZnO, and $In_2O_3$. That is, since the second pixel electrode 222 may include a metal oxide and may be formed as a thin film, the second pixel electrode 222 may have a high resistance. If the second pixel electrode 22 has a large area, a large IR drop may occur, thereby failing to achieve uniform image quality. However, if the pattern reflective film 250 is formed of a metal having a resistance lower than that of a metal oxide as shown in the present embodiment, the resistance of the second pixel electrode 222 may be reduced. Since the pattern reflective film 250 may be formed only along the outer edge of the second pixel electrode 222, a transmittance of the second pixel region PA2 may not be reduced greatly.

Figure 12:
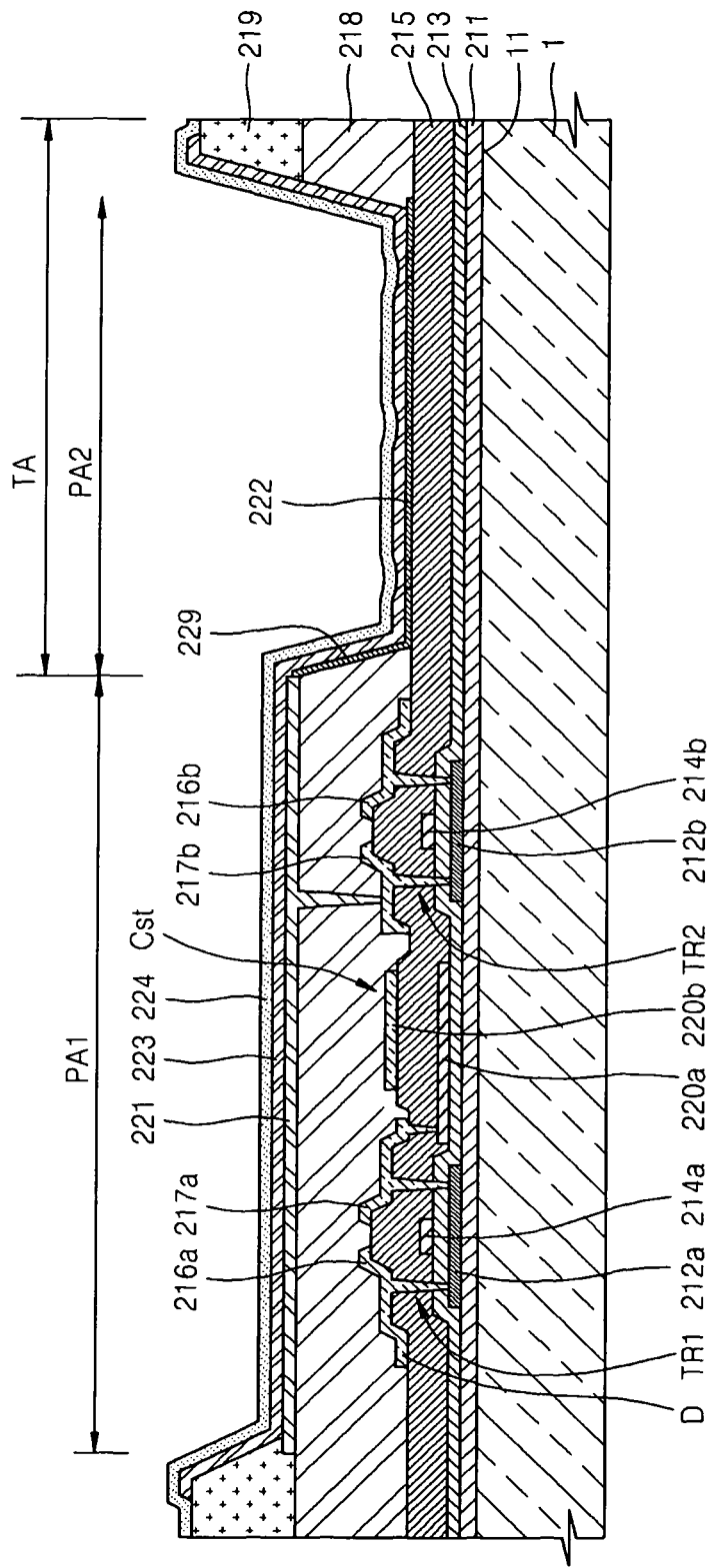
FIG. 12 illustrates a cross-sectional view of the organic light-emitting unit according to an exemplary embodiment.

FIG. 12 illustrates a cross-sectional view of the organic light-emitting unit 21 according to another exemplary embodiment.

When compared with the organic light-emitting unit 21 of FIG. 8, an opening 229 may be formed in at least some of insulating films in at least one area corresponding to the second pixel region PA2.

Due to the opening 229 of FIG. 12, a light transmittance of the transmission region TA may be further improved. Also, light interference due to transparent insulating films in the transmission region TA and color purity drop and color change due to the light interference may be reduced and/or prevented.

In order to increase an external light transmittance of the transmission region TA, an area of the transmission region TA may be increased or a transmittance of a material used to form the transmission region TA may be increased. However, there is a limitation in increasing the area of the transmission region TA due to a limitation in a design of the pixel circuit unit PC, and thus the transmittance of the material used to form the transmission region TA should be increased. However, there is a limitation in increasing the transmittance of the material due to a difficulty in developing a material. Also, since the second pixel region PA2 is located in a large part of the transmission region TA as described above, there is a limitation in increasing an external light transmittance of the transmission region TA. Accordingly, the limitations in increasing the area of the transmission region TA and increasing the transmittance of the material used to form the transmission region TA may be overcome and an external light transmittance may be increased by forming the opening 229.

In FIG. 12, the opening 229 may be formed in the passivation film 218 that covers the pixel circuit unit PC. Although the opening 229 may be formed in the passivation film 218 in FIG. 12, the embodiments are not limited thereto, and openings connected to the opening 229 may be further formed in at least one of the interlayer insulating film 215, the gate insulating film 213, and the buffer film 211, to further increase a light transmittance in the opening 229. The opening 229 may be as large as possible without contacting the scan line S, the data line D, and the Vdd line V.

As described above, since a second pixel electrode of a blue sub-pixel included in an area that permits dual emission may be bent, and an area of the blue sub-pixel may be greater than an area of any of other sub-pixels, a lifetime of the blue sub-pixel may be extended, and a color change value of a dual emission element may be similar to that of a top emission element.

A transparent organic light-emitting display device may be realized by increasing an external light transmittance and a pattern reflective film may be formed on a second pixel electrode in an area that permits dual emission such that outcoupling efficiency even during dual emission may be improved.

A light shielding film may be formed under a TFT that is disposed under a first pixel electrode in an area that permits top emission to reduce a reflectance of external light such that external light visibility may be improved.

By way of summation and review, an organic light-emitting display device may be formed as a transparent display device, e.g., by making a thin film transistor (TFT) or an organic light-emitting element therein transparent. However, light transmittances of the organic light-emitting element, the TFT, and the wires may not be very high and the spaces therebetween may be small. As such, an overall light transmittance of the organic light-emitting display device may not be very high.

If the organic light-emitting display device that is a transparent display device is turned off, an image of an object located at an opposite side may be transmitted through patterns of the organic light-emitting element, the TFT, and wires and spaces therebetween to a user. However, since light transmittances of the organic light-emitting element, the TFT, and the wires are not so high and the spaces therebetween are so small, an overall light transmittance of the organic light-emitting display device is not so high. Also, due to the patterns, that is, the patterns of the organic light-emitting element, the TFT, and the wires, the image may be transmitted as a distorted image to the user. This is because since distances between the patterns are several hundred nanometers (nm) which are similar to wavelengths of visible light, transmitted light may be scattered.

When compared with a liquid crystal display device, the organic light-emitting display device may be more easily formed as a dual emission display device. However, if the organic light-emitting display device is a dual emission display device, the organic light-emitting display device may have limitations in that the organic light-emitting display device may not use a reflective anode, optical resonance may not be achieved, and high outcoupling efficiency may not be achieved. If, in the organic light-emitting display device, a transparent anode is replaced with a semi-transparent anode in order to improve efficiency, a transparency may be reduced and it may make it difficult to form the organic light-emitting display device as a transparent organic light-emitting display device.

A blue sub-pixel of the dual emission light-emitting display device may have a short lifetime in comparison with red and green sub-pixels, and there may be difference in color change value between the dual emission light-emitting display device and a top emission light-emitting display device. Accordingly, there is a demand for extending the lifetime of the blue sub-pixel of the dual emission light-emitting display device and making a color change value of the dual emission light-emitting display device similar to that of the top emission light-emitting display device.

In this regard, aspects of the embodiments may be realized by providing a transparent organic light-emitting display device which extends a lifetime of a blue sub-pixel and increases a color change value of a dual emission element.

Embodiments may also be realized by providing an organic light-emitting display device that improves a light transmittance of a transmission region, improves outcoupling efficiency even during dual emission, and improves external light visibility.

Embodiments have been particularly shown and described with reference to exemplary embodiments thereof, it will be understood by those of ordinary skill in the art that various changes in form and details may be made therein without departing from the spirit and scope of the present invention as defined by the following claims. Therefore, the scope of the invention is defined not by the detailed description of the invention but by the appended claims, and all differences within the scope will be construed as being included in the present invention.

What is claimed is:

1. An organic light-emitting display device, comprising:
a first sub-pixel, a second sub-pixel, and a third sub-pixel on a substrate; and
a transmission region commonly formed on the first sub-pixel, the second sub-pixel, and the third sub-pixel, the transmission region transmitting external light; wherein:
each of the first, second, and third sub-pixels includes:
a pixel circuit unit adjacent to the transmission region and including at least one thin film transistor (TFT);
a first pixel electrode electrically connected to the TFT of the pixel circuit unit, the first pixel electrode overlapping the pixel circuit unit to cover the TFT and including a reflective film formed of a conductive material that permits light reflection;
a second pixel electrode in the transmission region, the second pixel electrode being electrically connected to the first pixel electrode and being formed of a conductive material that permits light transmission; and
a counter electrode that faces the first pixel electrode and the second pixel electrode;
the first sub-pixel includes a first organic film between the counter electrode and the first and second pixel electrodes of the first sub-pixel, and comprises a red light-emitting layer,
the second sub-pixel includes a second organic film between the counter electrode and the first and second pixel electrodes of the second sub-pixel, and comprises a green light-emitting layer, and
the third sub-pixel includes a third organic film between the counter electrode and the first and second pixel electrodes of the third sub-pixel, and comprises a blue light-emitting layer.

2. The organic light-emitting display device of claim 1, wherein an area of the third sub-pixel is greater than an area of the first sub-pixel or an area of the second sub-pixel.

3. The organic light-emitting display device of claim 1, wherein an area of the second pixel electrode of the third sub-pixel is greater than an area of the first pixel electrode of the third sub-pixel.

4. The organic light-emitting display device of claim 1, wherein the first sub-pixel, the second sub-pixel, and the third sub-pixel are sequentially arranged to be parallel to each other, and the second pixel electrode of the third sub-pixel is bent toward the first sub-pixel and the second sub-pixel.

5. The organic light-emitting display device of claim 1, wherein the counter electrode includes a metal, the metal including at least one of silver (Ag), manganese (Mg), aluminum (Al), platinum (Pt), palladium (Pd), gold (Au), nickel (Ni), neodymium (Nd), iridium (Ir), chromium (Cr), lithium (Li), calcium (Ca), and an alloy thereof.

6. The organic light-emitting display device of claim 1, wherein the second pixel electrode includes a metal oxide, the metal oxide including at least one of indium tin oxide (ITO), indium zinc oxide (IZO), zinc oxide (ZnO), and $In_2O_3$.

7. The organic light-emitting display device of claim 1, wherein the reflective film includes a metal, the metal including at least one of Ag, Mg, Al, Pt, Pd, Au, Ni, Nd, Ir, Cr, Li, Ca, and an alloy thereof.

8. The organic light-emitting display device of claim 1, further comprising a plurality of wires that are electrically connected to the pixel circuit unit, at least one of the plurality of wires overlapping the first pixel electrode.

9. The organic light-emitting display device of claim 1, further comprising a passivation film that is under the first pixel electrode to cover the TFT and is formed of a transparent material.

10. The organic light-emitting display device of claim 1, further comprising a plurality of insulating films that corresponds to the transmission region and that each are formed of a transparent material.

11. The organic light-emitting display device of claim 1, further comprising a pattern reflective film that is along an outer edge of the second pixel electrode in the transmission region and is under the second pixel electrode.

12. The organic light-emitting display device of claim 1, wherein the pattern reflective film includes a metal, the metal including at least one of Ag, Mg, Al, Pt, Pd, Au, Ni, Nd, Ir, Cr, Li, Ca, and an alloy thereof.

13. The organic light-emitting display device of claim 1, further comprising a light shielding film under the TFT of the pixel circuit unit.

14. An organic light-emitting display device, comprising:
a first sub-pixel, a second sub-pixel, and a third sub-pixel on a substrate; and
each of the first, second, and third sub-pixels includes:
at least one TFT on the substrate;
a passivation film that covers the TFT;
a first pixel electrode on the passivation film and electrically connected to the TFT, the first pixel electrode overlapping the TFT to cover the TFT and including a reflective film formed of a conductive material that permits light reflection;
a second pixel electrode on the passivation film and electrically connected to the first pixel electrode, the second pixel electrode being formed of a conductive material that permits light transmission; and
a counter electrode that faces the first pixel electrode and the second pixel electrode, wherein:
the first sub-pixel includes a first organic film between the counter electrode and the first and second pixel electrodes of the first sub-pixel, and comprises a red light-emitting layer,
the second sub-pixel includes a second organic film between the counter electrode and the first and second pixel electrodes of the second sub-pixel, and comprises a green light-emitting layer, and
the third sub-pixel includes a third organic film between the counter electrode and the first and second pixel electrodes of the third sub-pixel, and comprises a blue light-emitting layer.

15. The organic light-emitting display device of claim 14, wherein an area of the third sub-pixel is greater than an area of the first sub-pixel or an area of the second sub-pixel.

16. The organic light-emitting display device of claim 14, wherein an area of the second pixel electrode of the third sub-pixel is greater than an area of the first pixel electrode of the third sub-pixel.

17. The organic light-emitting display device of claim 14, wherein the first sub-pixel, the second sub-pixel, and the third sub-pixel are sequentially arranged to be parallel to each other, and the second pixel electrode of the third sub-pixel is bent toward the first sub-pixel and the second sub-pixel.

18. The organic light-emitting display device of claim 14, further comprising a pattern reflective film along an outer edge of the second pixel electrode and under the second pixel electrode.

19. The organic light-emitting display device of claim 18, wherein the pattern reflective film includes a metal, the metal including at least one of Ag, Mg, Al, Pt, Pd, Au, Ni, Nd, Ir, Cr, Li, Ca, and an alloy thereof.

20. The organic light-emitting display device of claim 14, further comprising a light shielding film under the TFT.

* * * * *